United States Patent
Chuang et al.

(10) Patent No.: US 10,504,758 B2
(45) Date of Patent: Dec. 10, 2019

(54) NOZZLE HAVING REAL TIME INSPECTION FUNCTIONS

(71) Applicant: TAIWAN SEMICONDUCTOR MANUFACTURING COMPANY LTD., Hsinchu (TW)

(72) Inventors: Kai-Lin Chuang, Chia-Yi (TW); Tsung-Chi Chen, Taichung (TW); Pei-Jung Chang, Taichung (TW); Chun-Wei Huang, Taichung (TW); Jun Xiu Liu, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 249 days.

(21) Appl. No.: 14/180,912

(22) Filed: Feb. 14, 2014

(65) Prior Publication Data

US 2015/0231657 A1 Aug. 20, 2015

(51) Int. Cl.
*H01L 21/67* (2006.01)
*H01L 21/66* (2006.01)
*B05B 12/08* (2006.01)

(52) U.S. Cl.
CPC ...... *H01L 21/67253* (2013.01); *B05B 12/082* (2013.01); *H01L 21/67288* (2013.01); *H01L 22/12* (2013.01); *H01L 22/26* (2013.01)

(58) Field of Classification Search
CPC ......... H01L 21/67253; H01L 21/67288; H01L 22/12; H01L 22/26; B05B 12/082
USPC .............................................. 239/398, 71, 74
See application file for complete search history.

(56) References Cited

U.S. PATENT DOCUMENTS

| | | | | |
|---|---|---|---|---|
| 4,700,870 A | * | 10/1987 | Schleicher | B67D 7/763 118/688 |
| 5,277,927 A | * | 1/1994 | Burns | B05B 12/082 427/8 |
| 5,320,250 A | * | 6/1994 | La | B05C 5/0225 222/1 |
| 5,452,076 A | * | 9/1995 | Schopper | G01F 23/292 356/128 |
| 5,517,768 A | * | 5/1996 | Aviv | B05B 5/025 34/255 |
| 5,520,331 A | * | 5/1996 | Wolfe | A62C 31/02 239/398 |
| 5,559,339 A | * | 9/1996 | Domanik | G01N 35/1016 250/222.1 |
| 5,868,840 A | * | 2/1999 | Klein, II | B05B 15/06 118/300 |
| 6,082,605 A | * | 7/2000 | Farnworth | B23K 3/0623 222/590 |
| 6,617,079 B1 | * | 9/2003 | Pillion | G03F 7/162 427/10 |
| 7,063,747 B2 | * | 6/2006 | Lastowka | B05B 15/08 118/669 |

(Continued)

FOREIGN PATENT DOCUMENTS

EP 0222258 A2 * 5/1987 ............... B24C 7/00

*Primary Examiner* — Jason J Boeckmann
(74) *Attorney, Agent, or Firm* — WPAT, P.C., Intellectual Property Attorneys; Anthony King

(57) ABSTRACT

A nozzle for emitting a fluid comprises a channel, a light source and a light sensor. The channel is configured to flow the fluid. The light source is configured to emit light towards a surface on which the fluid is applied and the light sensor is configured to receive reflected light from the surface.

18 Claims, 7 Drawing Sheets

(56) References Cited

U.S. PATENT DOCUMENTS

| | | | | |
|---|---|---|---|---|
| 7,081,611 B2* | 7/2006 | Scott | A01B 79/005 | 239/155 |
| 7,374,066 B2* | 5/2008 | Jackson | A47K 5/1217 | 222/190 |
| 7,517,469 B2* | 4/2009 | Herchen | G01F 1/7086 | 216/84 |
| 7,839,417 B2* | 11/2010 | Ebensberger | G09B 9/00 | 345/419 |
| 8,109,301 B1* | 2/2012 | Denise | F25D 23/126 | 141/360 |
| 9,010,580 B2* | 4/2015 | Rolek | F25D 23/126 | 141/94 |
| 2002/0183935 A1* | 12/2002 | Skinner | A01G 17/02 | 702/19 |
| 2003/0180444 A1* | 9/2003 | Takekuma | H01L 21/67253 | 427/8 |
| 2004/0174530 A1* | 9/2004 | Usui | H01J 37/32935 | 356/504 |
| 2006/0032936 A1* | 2/2006 | Proch | B05B 17/085 | 239/16 |
| 2007/0056637 A1* | 3/2007 | Okubo | B01J 2/06 | 137/551 |
| 2007/0121123 A1* | 5/2007 | Woodruff | H01L 21/67253 | 356/630 |
| 2007/0251450 A1* | 11/2007 | Lin | H01L 21/6715 | 118/684 |
| 2008/0035666 A1* | 2/2008 | Porras | H01L 21/6715 | 222/1 |
| 2008/0144003 A1* | 6/2008 | Blackford | G01F 1/661 | 356/37 |
| 2011/0268348 A1* | 11/2011 | Vaughnn | G01N 21/8851 | 382/151 |
| 2014/0078502 A1* | 3/2014 | Buchanan | B05B 1/02 | 356/338 |
| 2014/0242731 A1* | 8/2014 | Mauer | H01L 22/12 | 438/8 |
| 2014/0246607 A1* | 9/2014 | Bykanov | G03F 1/22 | 250/504 R |

* cited by examiner

NOZZLE HAVING REAL TIME INSPECTION FUNCTIONS

BACKGROUND

In semiconductor manufacturing, various tools or devices may be used to monitor the fabrication processes. For example, an off-line, high speed camera or a video recorder is utilized to monitor the shape of a liquid stream or a mist from a nozzle during fabrication processes in order to determine if variation occurs in applying the liquid stream or mist. Images of shape variation, if any, are captured by the off-line, high speed camera or the video recorder but are not sent for analysis in real time. Operation of the nozzle may not be ceased when variation is detected.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
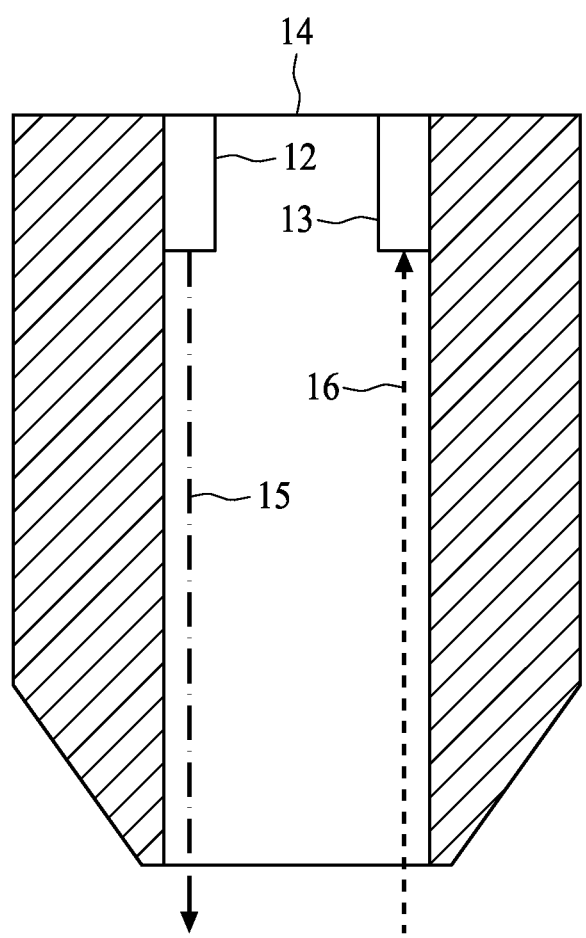
FIG. 1 is a schematic cross-sectional view of a nozzle in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic cross-sectional view of a nozzle 11 in accordance with some embodiments. Referring to FIG. 1, nozzle 11 comprises a light source 12, a light sensor 13 and a channel 14.

Nozzle 11 is configured to flow a fluid including, for example, a liquid stream, a gas or a mist. The liquid stream and the mist includes chemical solution and water.

In some embodiments, water includes distilled water with a refractive index of approximately 1.33, which is used in a clean process.

In some embodiments, the chemical solution includes $H_2SO_4$ with a refractive index of approximately 1.44, which is used for removing photo resist in a Caro's process.

In some embodiments, the chemical solution includes KOH with a refractive index of approximately 1.48, which is used for photo resist development.

In some embodiments, the chemical solution includes FH with a refractive index approximately 1.4, which is used for removing oxide.

In some embodiments, the chemical solution includes Tris-Borate-EDTA with a refractive index of approximately 1.63, which is used for removing oxide.

In some embodiments, the chemical solution includes HCL with a refractive index of approximately 1.34, which is used for removing nitride.

In some embodiments, the chemical solution includes $H_3PO_4$ with a refractive index of approximately 1.43, which is used for removing nitride.

In some embodiments, the chemical solution includes tetramethyl ammonium hydroxide with a refractive index of approximately 1.38, which is used for etching silicon.

Light source 12 is configured to emit light 15 via channel 14 towards liquid stream applied from nozzle 11 onto a surface of a wafer. In this embodiment, light source 12 is embedded in nozzle 11 and disposed near an exit of nozzle 11.

Light 15 emitted from light source 12 propagates in channel 14, travels out of nozzle 11 in the applied fluid and is reflected by a reflecting surface. Due to the optical phenomenon of Total Internal Reflection (TIR), emitting light 15 and reflected light are confined in the fluid applied. Moreover, the wavelength of light 15 may be predetermined so that light 15 does not affect the surface property and can be confined in the fluid. For example, when the wavelength of light 15 is smaller than 365 nm, photo resist layers of a wafer may be damaged. Moreover, when the wavelength of light 15 is over 365 nm, light 15 acts as a radio wave and is difficult to be confined in a liquid stream. In some embodiments, the wavelength of light 15 is in a range from approximately 365 nanometers (nm) to 760 nanometers (nm).

Light sensor 13 is configured to receive reflected light 16 from the fluid via channel 14. In this embodiment, light sensor 13 is embedded in nozzle 11 and disposed near the exit of nozzle 11. Moreover, light sensor 13 is opposite to light source 12.

In some embodiments, nozzle 11 is configured to operate under a liquid stream mode to allow a liquid stream to flow in channel 14. In other embodiments, nozzle 11 is configured to operate under a mist mode to allow a gas to flow in channel 14.

Figure 2:
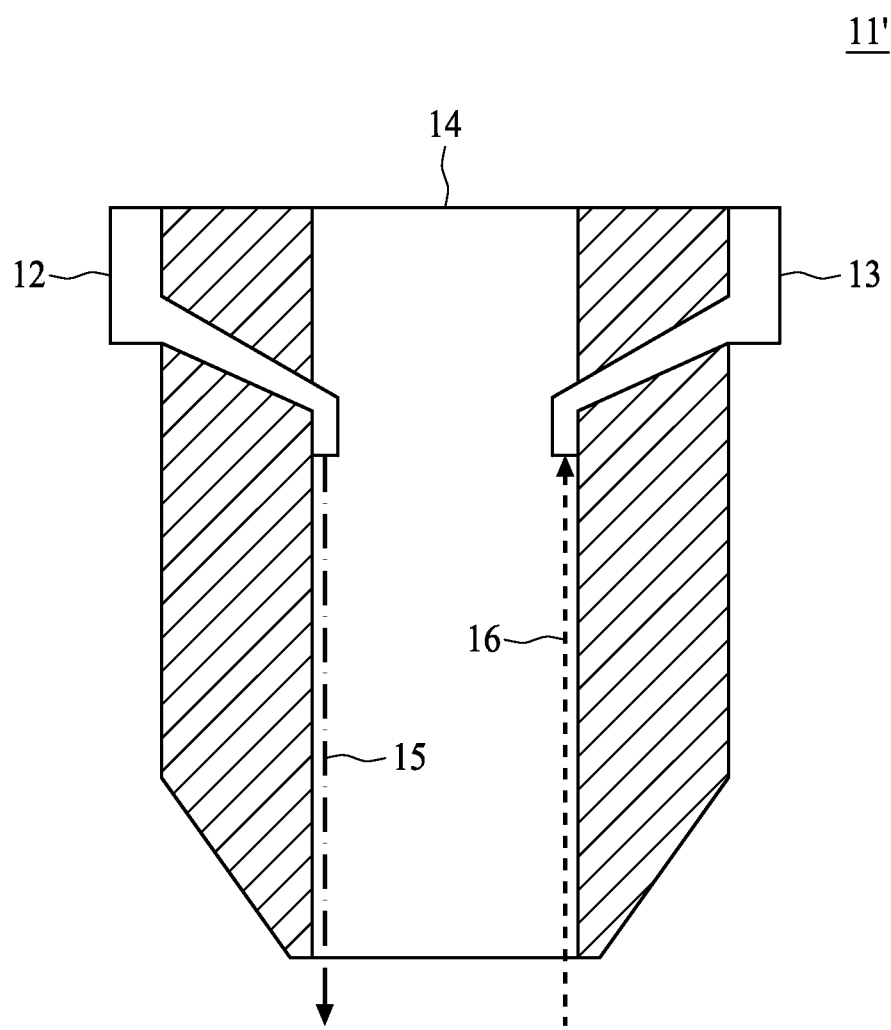
FIG. 2 is a schematic cross-sectional view of a nozzle in accordance with some embodiments.

FIG. 2 is a schematic cross-sectional view of a nozzle 11' in accordance with some embodiments. Referring to FIG. 2, nozzle 11' is similar to nozzle 11 illustrated in FIG. 1 except that, for example, light source 12 and light sensor 13 are disposed on an exterior surface of a housing of nozzle 11'. In an embodiment, light source 12 and light sensor 13 are detachable and can be easily replaced when light source 12 or light sensor 13 is damaged.

Figure 3:
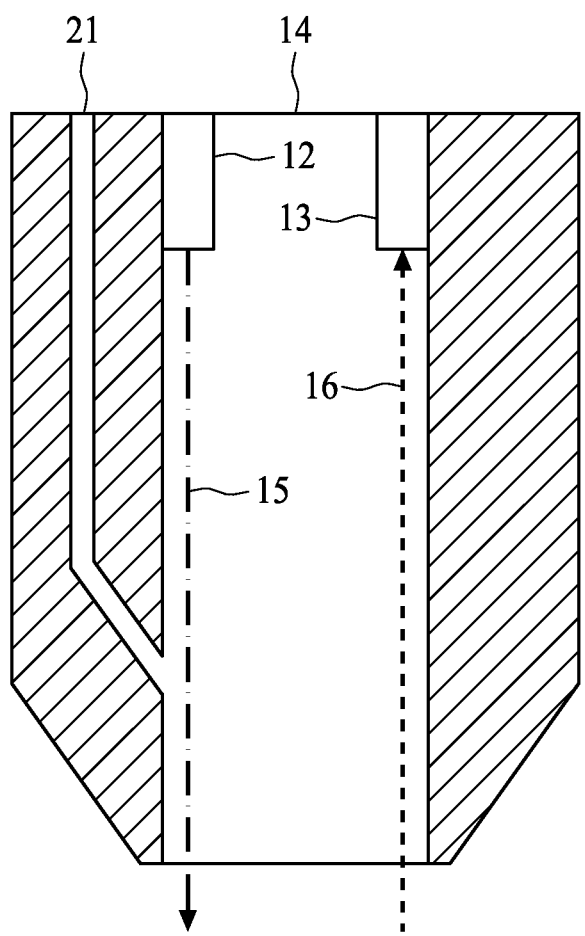
FIG. 3 is a schematic cross-sectional view of a nozzle in accordance with some embodiments.

FIG. 3 is a schematic cross-sectional view of a nozzle 11" in accordance with some embodiments. Referring to FIG. 3, nozzle 11" is similar to nozzle 11 illustrated in FIG. 1 except that, for example, at least one channel 21 for flowing a gas is provided. The at least one channel 21 communicates with channel 14. In an embodiment, channel 14 is configured to flow a liquid stream. As a result, nozzle 11" is capable of operating under a liquid stream mode or a mist mode.

Figure 4:
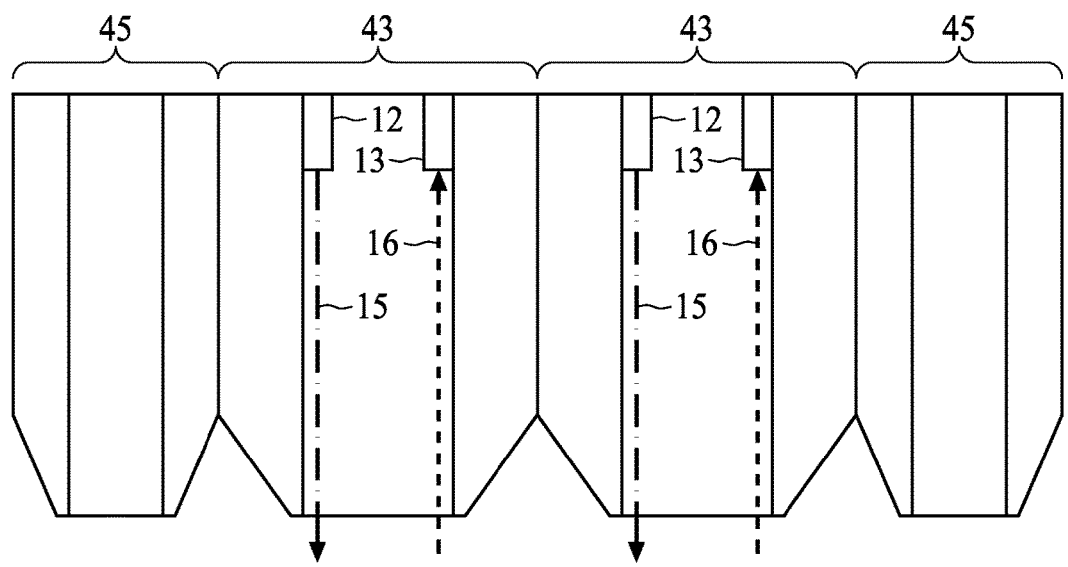
FIG. 4 is a schematic cross-sectional view of a multi-nozzle device in accordance with some embodiments.

FIG. 4 is a schematic cross-sectional view of a multi-nozzle device 41 in accordance with some embodiments. Referring to FIG. 4, multi-nozzle device 41 includes at least one liquid stream nozzle 43 and at least one gas nozzle 45. Each of the at least one liquid stream nozzles 43 is similar to nozzle 11" illustrated in FIG. 3 and is configured to flow a liquid stream. Moreover, each of the at least one liquid stream nozzle 43 includes light source 12 and light sensor 13. In this embodiment, each of the at least one gas nozzle 45 is configured to flow a gas.

Figure 5:
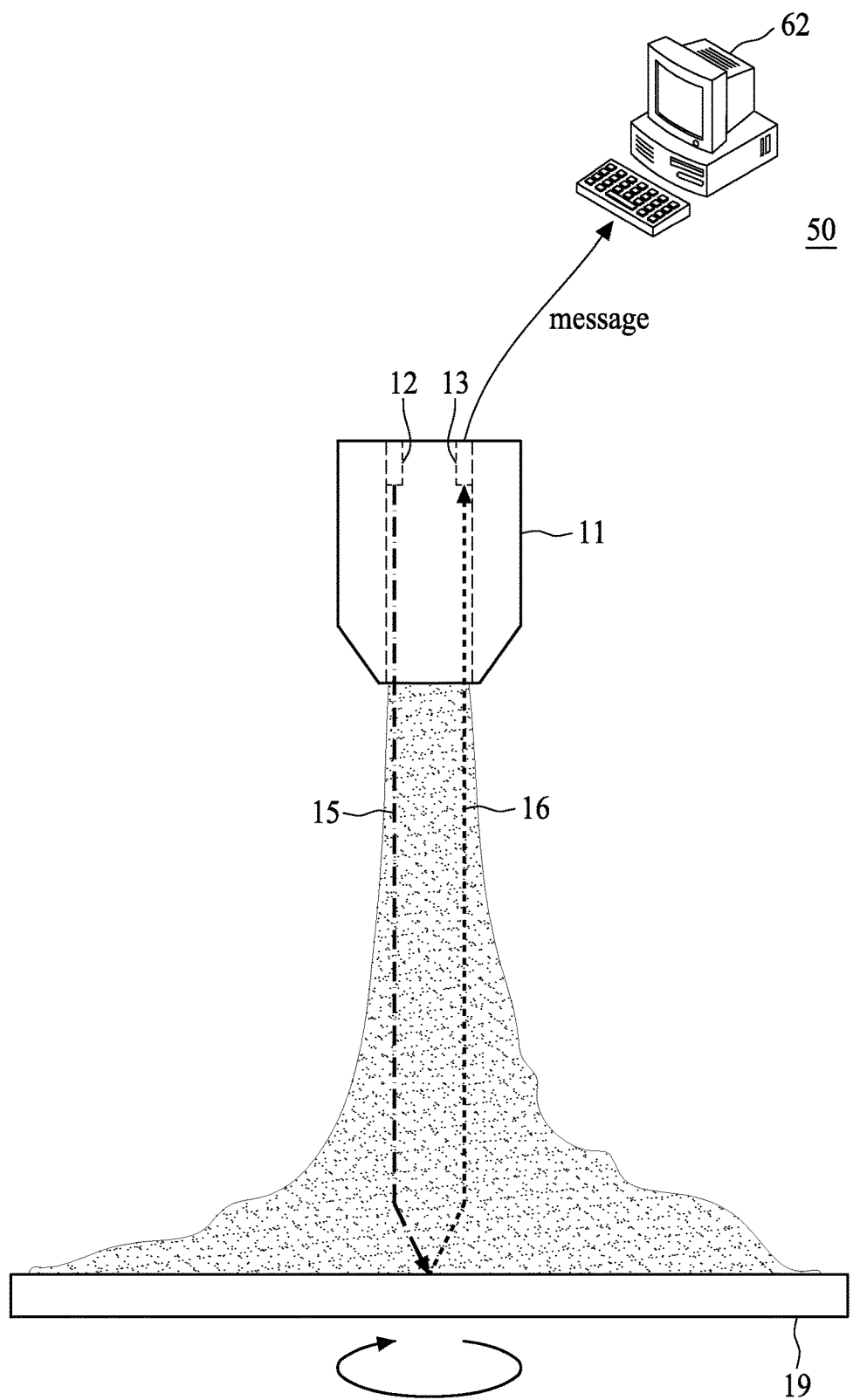
FIG. 5 is a schematic diagram of a monitoring system for detecting changes in the shape of a liquid stream in accordance with some embodiments.

FIG. 5 is a schematic diagram of a monitoring system 50 for detecting changes in the shape of a liquid stream in accordance with some embodiments. Referring to FIG. 5, nozzle 11 operating under a liquid stream mode applies a liquid stream 61 on a wafer 19. Reflected light 16 is collected when light 15 applied on wafer 19 is reflected back to nozzle 11. Light sensor 13 receives reflected light 16 in liquid stream 61. A signal indicative of a status of reflected light 16 received by light sensor 13 is transmitted to a data analysis device 62 such as a computer. Data analysis device 62 then generates a signal indicating whether a variation occurs.

Since the refractive index of the liquid stream 61 is greater than the refractive index of air, due to TIR, light 15 and reflected light 16 are substantially confined in liquid stream 61. Therefore, when the shape of liquid stream 61 changes because, for example, liquid stream 61 is discontinuous or broken, or liquid stream 61 includes a mist, or the shape of liquid stream 61 changes in size, a variation is detected at the time of the shape change of liquid stream 61. Meanwhile, operation of nozzle 11 will be stopped in real time when the variation is detected.

Figure 6:
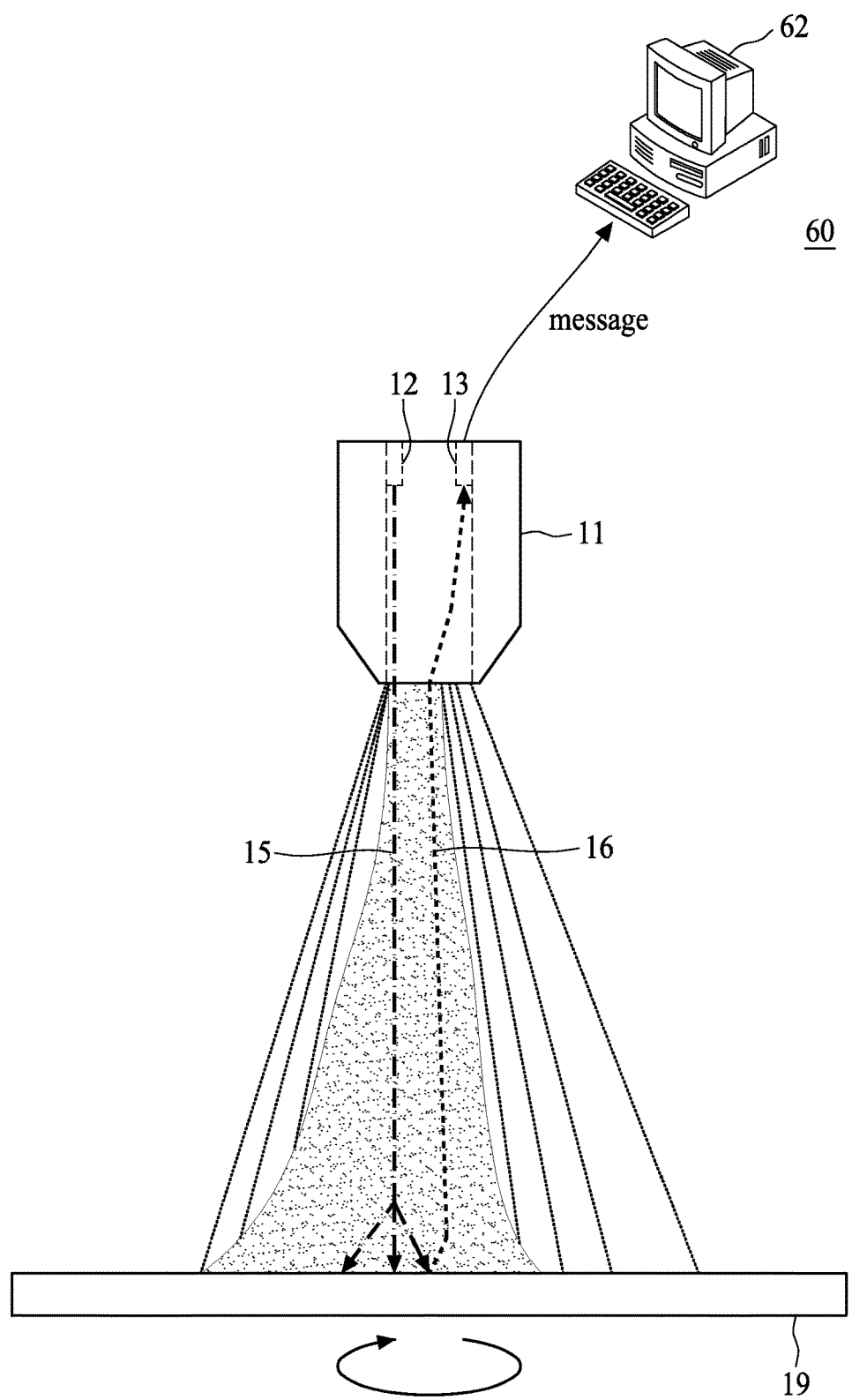
FIG. 6 is a schematic diagram of a monitoring system for detecting changes in the shape of a mist in accordance with some embodiments.

FIG. 6 is a schematic diagram of a monitoring system 60 for detecting changes in the shape of a mist 71 in accordance with some embodiments. Referring to FIG. 6, nozzle 11 applies a mist 71 on wafer 19. Since mist 71 includes discrete liquid drops, light 15 and light 16 are not able to propagate in mist 71. Therefore, when nozzle 11 operates under the mist mode, reflected light 16 is not received by light sensor 13. A indicative of a status of reflected light 16 received by light sensor 13 is transmitted to data analysis device 62. Data analysis device 62 then generates a signal indicating whether a variation occurs.

Since the refractive index of the mist 71 is greater than the refractive index of air, light 15 and reflected light 16 are still confined in mist 71. Under the mist mode, when the shape of mist 71 changes because, for example, mist 71 includes a liquid stream, a variation is detected at the time of the shape change of mist 71. Meanwhile, operation of nozzle 11 will be stopped in real time when the variation is detected.

Figure 7:
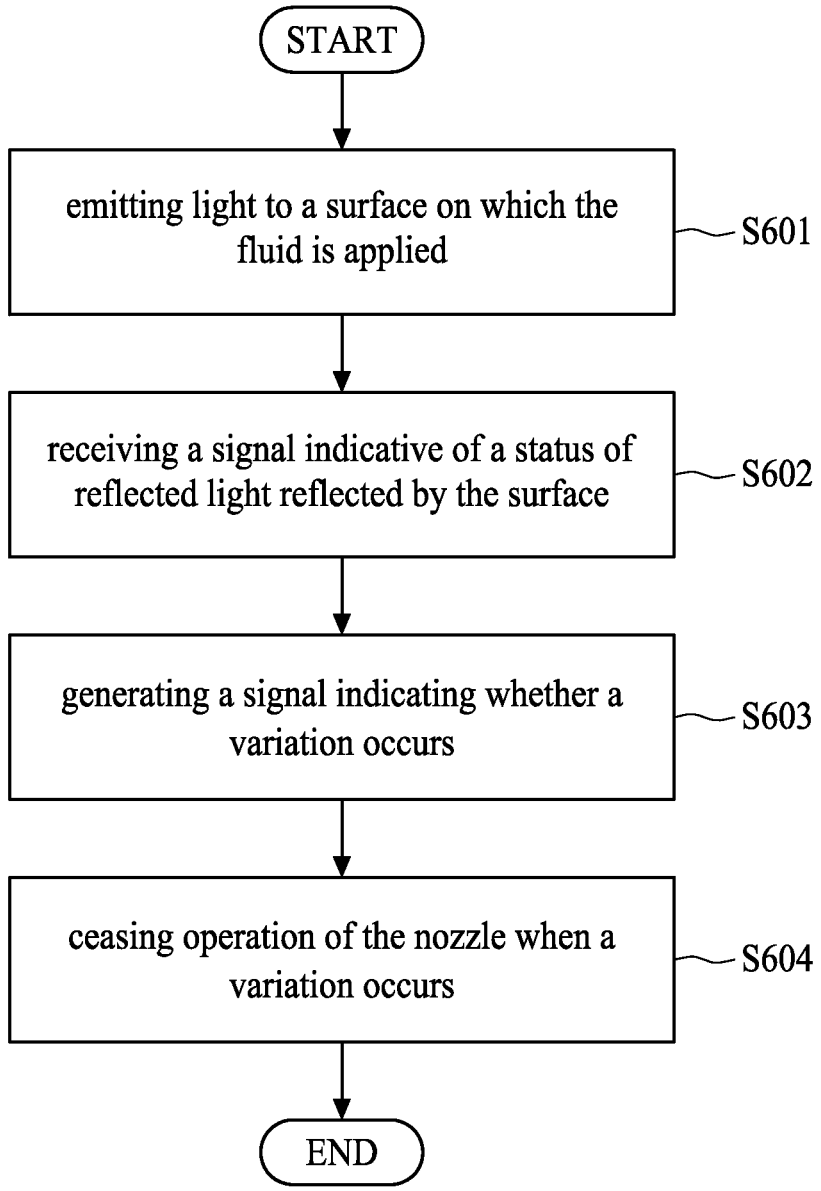
FIG. 7 is a flow diagram of a method for monitoring the shape of a fluid emitted by a nozzle in accordance with some embodiments.

FIG. 7 is a flow diagram of a method for monitoring the shape of a fluid emitted by a nozzle in accordance with some embodiments. Referring to FIG. 7, in operation S601, light is emitted from a light source toward the fluid applied via a channel of the nozzle to a surface of a wafer. The fluid includes a liquid stream or a mist.

When the nozzle operates under a liquid stream mode, a liquid stream and the emitting light are applied on a wafer. The reflected light reflected by the wafer is collected. Since the refractive index of the liquid stream is greater than that of air, the emitting light and the reflected light are able to propagate in the liquid stream. Therefore, under the liquid stream mode, the reflected light propagates back to the nozzle and received by a light sensor.

When the nozzle operates under a mist mode, a mist is applied on a wafer. Since the mist includes discrete liquid drops, the light is not able to propagate in the mist and no reflected light can be collected.

In operation S602, a signal indicative of a status of reflected light received by a light sensor is transmitted to and is recorded by a data analysis device.

In operation S603, a signal indicating whether a variation occurs is generated by the data analysis device. In some embodiments, as in operation S604, a curve of signals collected over time is provided by the data analysis device. Moreover, a singularity point in the curve represents a variation in the fluid applying process.

When the nozzle operates under the liquid stream mode and the shape of the liquid stream changes because, for example, the liquid stream is broken, or the liquid stream includes a mist, or the shape of the liquid stream changes in size, reflected light does not propagate back to the nozzle and thus no reflected light is received by the light sensor. Therefore, a singularity point in the curve is detected. Meanwhile, operation of the nozzle will be stopped in real time when the singularity point is detected.

Moreover, when the nozzle operates under the mist mode, and the shape of the liquid stream changes because, for example, the mist includes a liquid stream, reflected light propagates back to the nozzle and received by the light sensor. Therefore, a singularity point in the curve is detected. Meanwhile, operation of the nozzle will be stopped in real time when the singularity point is detected.

In summary, a nozzle having a light source and a light sensor provides real-time monitoring during a fluid applying process. The nozzle utilizes "light" as a media to monitor variations in the shape of a liquid stream or a mist and thus provides a real-time detection. Effectively, semiconductor equipment having the nozzle can stop working instantly when an abnormal situation occurs.

According to some embodiments, a nozzle for emitting a fluid comprises a channel, a light source and a light sensor. The channel is configured to flow the fluid. The light source is configured to emit light towards a surface on which the fluid is applied and the light sensor is configured to receive reflected light from the surface.

In some embodiments, the fluid includes one of a mist and a liquid stream.

In some embodiments, the nozzle further comprises another channel configured to flow a gas.

In some embodiments, the light source and the light sensor are embedded in the nozzle.

In some embodiments, the light source and the light sensor are disposed on an exterior surface of a housing of the nozzle.

In some embodiments, the wavelength of the light emitting from the light source ranges from 365 nanometers (nm) to 760 nanometers (nm).

According to some embodiments, a system for monitoring variation in a fluid comprises a nozzle, and a data analyzing device. The nozzle comprises a channel configured to flow the fluid, a light source configured to emit light to a surface on which the fluid is applied and a light sensor configured to receive reflected light from the surface. The data analyzing device is configured to record a signal indicative of a status of the reflected light and generate a signal indicating whether a variation occurs.

In some embodiments, the fluid includes one of a mist and a liquid stream.

In some embodiments, the nozzle further comprises another channel configured to flow a gas.

In some embodiments, the light source and the light sensor are embedded in the nozzle.

In some embodiments, the light source and the light sensor are disposed on an exterior surface of a housing of the nozzle.

In some embodiments, the wavelength of the light emitting from the light source ranges from 365 nanometers (nm) to 760 nanometers (nm).

In some embodiments, the data analyzing device includes a computer.

According to some embodiments, a method for monitoring the shape of a fluid emitted by a nozzle is provided. The method comprises emitting light to a surface on which the fluid is applied, receiving a signal indicative of a status of reflected light reflected by the surface, generating a signal indicating whether a variation occurs and ceasing operation of the nozzle when a variation occurs.

In some embodiments, the fluid includes one of a mist and a liquid stream.

In some embodiments, the nozzle further comprises another channel configured to flow a gas.

In some embodiments, after receiving a signal indicative of a status of reflected light, the method further comprises recording the indicative signal.

In some embodiments, the indicative signal is recorded by a data analysis device.

In some embodiments, the step of generating a signal indicating whether a variation occurs comprises collecting the indicative signal over time, generating a curve of indicative signals collected over time and detecting a singularity point in the curve.

In some embodiments, the wavelength of the light ranges from 365 nanometers (nm) to 760 nanometers (nm).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A nozzle for emitting a fluid, comprising:
   a housing having a first channel and a second channel, wherein the first channel allows the fluid to flow through;
   a light source that emits light towards a surface of a wafer on which the fluid is applied, wherein the wafer is external to the nozzle; and
   a light sensor that receives reflected light from the surface of the wafer, the light source and the light sensor being disposed within the first channel and offset from a longitudinal central axis of the first channel,
   wherein the housing further comprises outer sidewalls, the inner sidewalls between the outer sidewalls, the inner sidewalls and a first portion of the second channel are parallel to the longitudinal central axis of the first channel, the inner sidewalls define the first channel, and the first portion of the second channel is spaced apart from the first channel and between the inner sidewalls and the outer sidewalls.

2. The nozzle of claim 1, wherein the light sensor further receives the reflected light that enters the first channel and impinges on the light sensor in a direction parallel to the inner sidewalls of the housing.

3. The nozzle of claim 1, wherein the second channel allows a gas to flow through.

4. The nozzle of claim 1, wherein the light source and the light sensor are disposed on opposite sides of the inner sidewalls defining the first channel.

5. The nozzle of claim 1, wherein the second channel further comprises a second portion coupling the first portion with the first channel.

6. The nozzle of claim 1, wherein the housing further comprises an upper surface coplanar with a top surface of the light source and a top surface of the light sensor, and a longitudinal axis of each of the light source and the light sensor is parallel to a direction in which the emitted light and the reflected light travel.

7. The nozzle of claim 1, wherein the nozzle allows a liquid stream to flow under a liquid stream mode and allows a gas to flow under a mist mode, wherein the nozzle stops operation in response to detecting a size variation of the liquid stream that is applied on the wafer under the liquid stream mode.

8. The nozzle of claim 1, wherein the emitted light and the reflected light are entirely included in the fluid flowing in a space between the nozzle and the wafer.

9. A nozzle for providing a fluid, comprising:
   a housing comprising:
      a first channel that allows the fluid to flow out of the first channel and reach a surface of a workpiece external to the housing, the fluid comprising a first refractive index greater than a second refractive index of air and the housing comprising inner sidewalls circumscribing the first channel; and
      a second channel that allows a gas to flow through;
   a light source disposed on a first side of the inner sidewalls that emits light along the first side towards the surface of the workpiece, an entirety of the emitted light being confined within the fluid along a path between the first channel and the workpiece; and
   a light sensor disposed on a second side of the inner sidewalls of the housing and that receives light reflected from the surface of the workpiece on which the fluid is applied,
   wherein a longitudinal axis of each of the light source and the light sensor is parallel to and offset from a longitudinal central axis of the first channel.

10. The nozzle of claim 9, wherein the emitted light of the light source propagates in the first channel in a direction parallel to a direction along which the reflected light propagates in the first channel.

11. The nozzle of claim 9, wherein the workpiece is a semiconductor wafer.

12. The nozzle of claim 9, wherein the light source and the light sensor are laterally surrounded by the inner sidewalls.

13. The nozzle of claim 9, wherein the housing further comprises outer sidewalls laterally surrounding the inner sidewalls and intermediate sidewalls between the outer sidewalls and the inner sidewalls, the intermediate sidewalls defining the second channel.

14. The nozzle of claim 9, wherein the second channel comprises:

a first portion spaced apart from and parallel to the first channel; and a second portion in communication with the first channel.

15. The nozzle of claim 9, wherein the nozzle allows a liquid stream to flow under a liquid stream mode and allows a gas to flow under a mist mode, wherein the nozzle stops operation in response to detecting a shape variation of the liquid stream that is applied to the workpiece under the liquid stream mode.

16. The nozzle of claim 15, wherein the shape variation of the liquid stream comprises the liquid stream being discontinuous or broken, or the liquid stream includes a mist.

17. A semiconductor manufacturing system, comprising:
a nozzle, the nozzle comprising:
a housing having a first channel that allows a liquid to flow through and a second channel that allows a gas to flow through;
a light source disposed within the first channel that emits light to a wafer spaced apart from the nozzle, the emitted light at least partially overlapping the liquid flowing in the first channel; and
a light sensor disposed within the first channel that receives light reflected from the wafer, the light source and the light sensor being offset from a longitudinal central axis of the first channel,
wherein the housing further comprises outer sidewalls and inner sidewalls between the outer sidewalls, the inner sidewalls and a first portion of the second channel are parallel to the longitudinal central axis of the first channel, the inner sidewalls define the first channel, and the first portion of the second channel is spaced apart from the first channel and between the inner sidewalls and the outer sidewalls.

18. The semiconductor manufacturing system of claim 17, wherein the reflected light propagates between the wafer and the first channel in a direction parallel to the longitudinal central axis of the first channel.

* * * * *